(12) United States Patent
Schneider et al.

(10) Patent No.: US 6,175,319 B1
(45) Date of Patent: Jan. 16, 2001

(54) POWER-TAILORED WRITE-CURRENT METHOD

(75) Inventors: Richard Crane Schneider, Boulder; Keith Gary Boyer, Thornton; Norman Lee Koren, Boulder, all of CO (US)

(73) Assignee: Storage Technology Corporation, Louisville, CO (US)

(*) Notice: Under 35 U.S.C. 154(b), the term of this patent shall be extended for 0 days.

(21) Appl. No.: 09/315,565

(22) Filed: May 20, 1999

(51) Int. Cl.[7] ........................................... H03M 5/06
(52) U.S. Cl. ......................................... 341/68; 360/65
(58) Field of Search ............................ 341/50, 68, 69, 341/70–73; 360/48, 53, 65

(56) References Cited

U.S. PATENT DOCUMENTS 4,063,235 * 12/1977 Ludwig ................................ 340/347
4,337,457 * 6/1982 Tache .................................. 340/347

* cited by examiner

Primary Examiner—Michael Tokar
Assistant Examiner—Don Phu Le
(74) Attorney, Agent, or Firm—Brooks & Kushman P.C.

(57) ABSTRACT

A method of generating an encoded signal from a sequential stream of digital data, where the encoded signal has a non-power carrying null state and a power carrying active state with two opposing polarities. Logical one bits are distinguished from logical zero bits by inverting the encoded signal's polarity at the start of only the logical one bits. The encoded signal is set to the active state during a bit set-up period before, and held in the active state during a bit hold period after each polarity inversion. At other times the encoded signal is set to the null state. The method may include the addition of equalization pulses during strings of consecutive logical zero bits to keep the encoded signal from remaining in the null state for extended periods. Each equalization pulse may be preceded by an equalization set-up period and followed by an equalization hold period where the encoded signal is in the active state. In the preferred embodiment the set-up periods, hold periods, and equalization pulse periods are one-third the duration period of the logical bits.

11 Claims, 4 Drawing Sheets

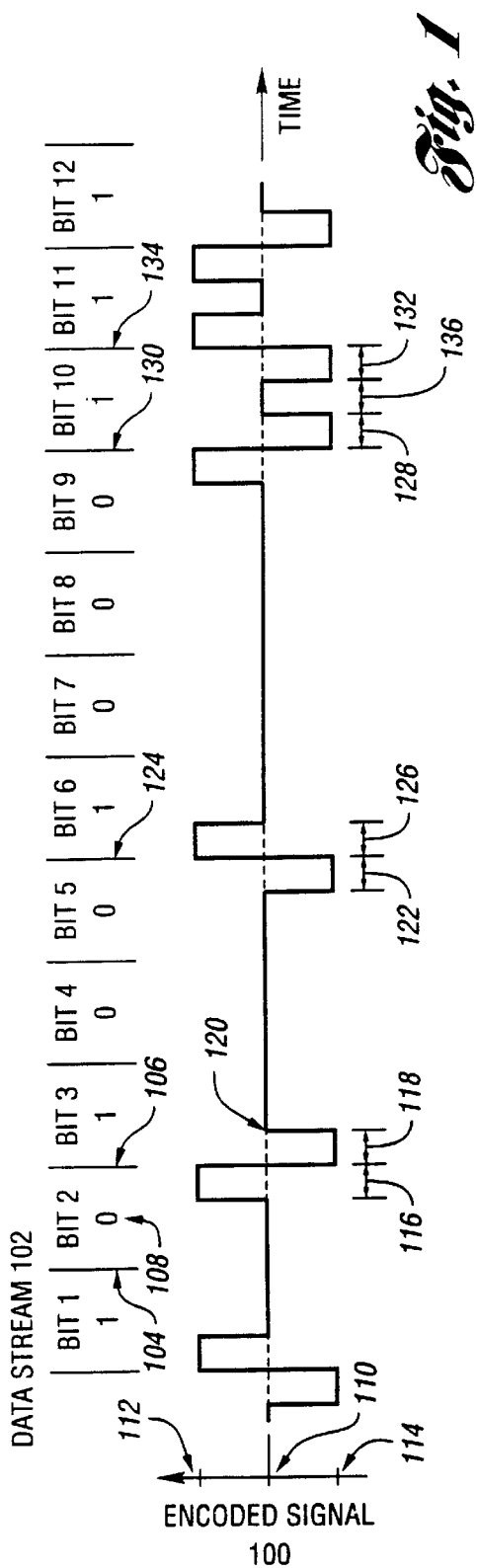
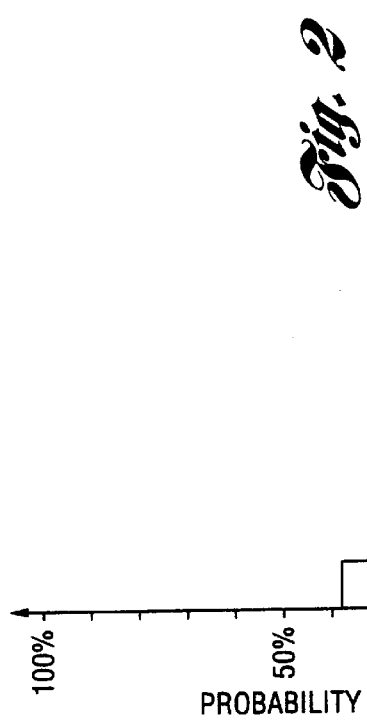

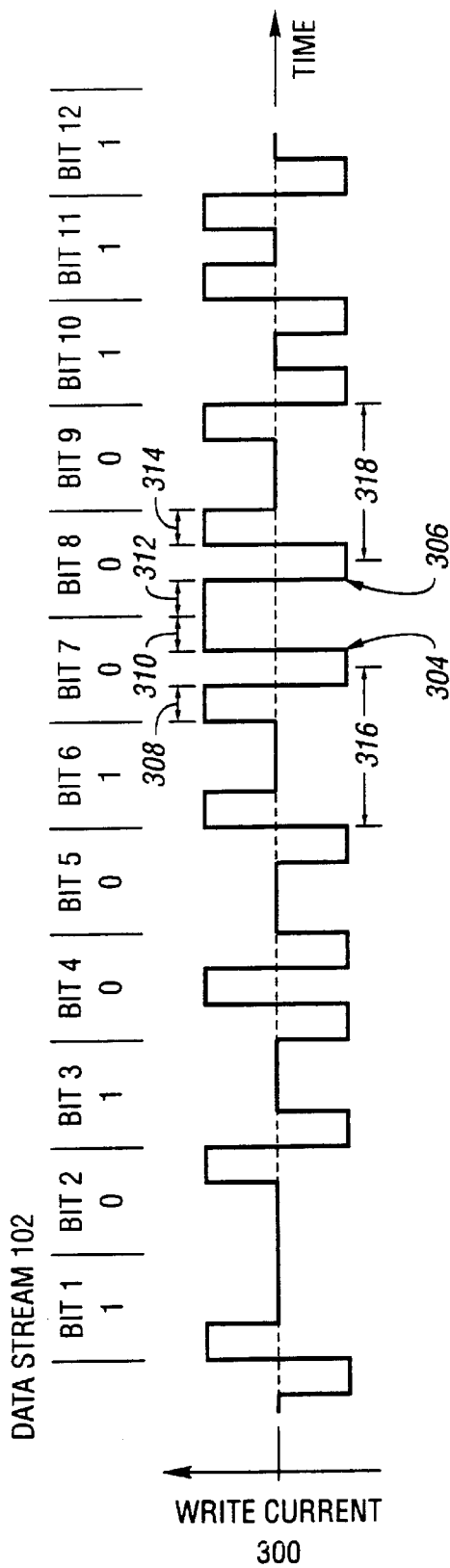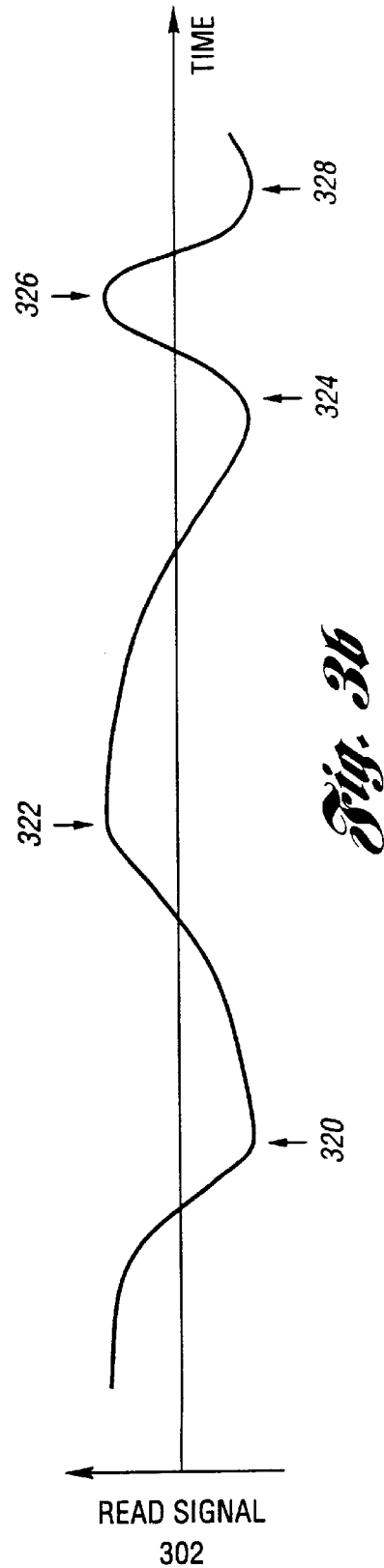

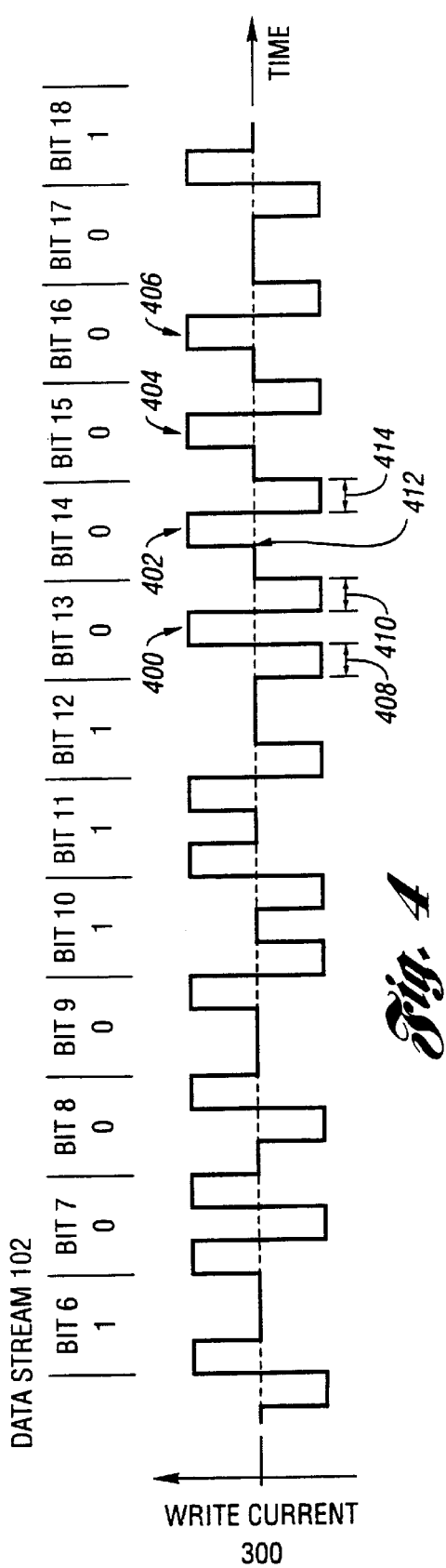
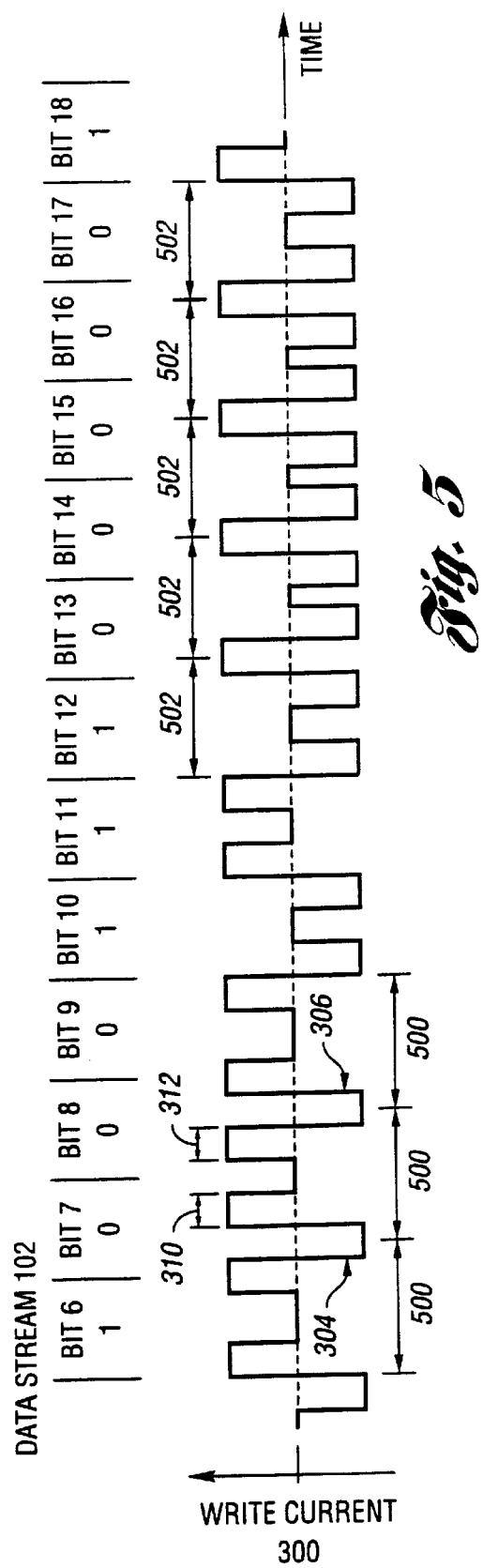

POWER-TAILORED WRITE-CURRENT METHOD

TECHNICAL FIELD

The present invention is related to a field of encoding a sequential stream of digital data.

BACKGROUND ART

Recording digital data on disks and tapes in accomplished by passing a write current through a magnetic transducer to align the magnetic domain of the medium in one of two opposing directions. To achieve high data densities on the medium, a non-return to zero inverting on the ones (NRZI) form of encoding is applied to the data stream to produce the write current. An NRZI encoded signal will maintain its present polarity for each logical zero bit in the data stream, and invert its polarity at the start of each logical one bit. The magnetic domain of the medium follows the write current by orienting in one direction when the write current has a positive polarity, and in the opposite direction when the write current has a negative polarity.

NRZI encoding has a limitation in tape drive and disk drive applications when presented with long strings of logical zero bits. During these long strings, the write current remains at the same polarity. This causes long regions in the data tracks to be magnetically oriented in the same direction. Long regions of uniform magnetic orientation sometimes cause a magneto-resistive read sensor to saturate, resulting in data errors.

The Full-Cell Write Equalization method was developed to prevent read sensor saturation. Full-Cell Write Equalization method briefly inverts the write current polarity one or more times during long string of zeros. These brief polarity inversions are called equalization pulses. For a string of N consecutive logical zero bits, the Full-Cell Write Equalization method generates N–X equalization pulses. The value of X is typically equal to d, the minimum number of zeros between adjacent ones for a (d,k) run length-limited modulation code. These equalization pulses are typically centered in time during the writing of the logical zero bits, starting with the first logical zero bit in the string. Other encoding methods space the equalization pulses at equal intervals between the NRZI transitions caused by logical one bits that lead and trail the string of consecutive logical zero bits.

Another problem occurs where data stream encoding causes the write current transitions at high frequencies. The net effect of these high frequency transitions is to shift the apparent position of the leading and trailing transitions as seen by the read sensor. These apparent shifts may sometimes cause problems in the read circuitry. The Write Pre-Compensation method compensates for the apparent shifts seen by offsetting the transition write positions in the opposite direction of the apparent shift. This method is well known in the field of disk drives. Shifts in the apparent position of the data on magnetic medium are sometimes caused by slow rise-times in the write transducers. The Write Pre-Emphasis method applies extra power at the start of a transition to produce a faster rise-time in the leading edge of the transitions. While these two methods reduce the apparent shifts, they require special circuitry to generate the complex write currents.

A common practice in the disk drive and tape drive industry is to read the data from the magnetic medium as it is being written to verify that the correct data is being recorded. For space and alignment purposes, the read sensors and write transducers are usually co-located in the same magnetic head. This close physical proximity, and the wiring connecting the magnetic head to circuit cards, results in cross-talk between the write channel and the read channel. Signals in the write channel are on the order of volts. Signals in the read channel are only on the order of millivolts. Consequently, any time power is applied to the write channel it is picked up in the read channel as unwanted noise.

The Uniform Pulse-Write method partially solves the problem of write signal noise in the read channel by reducing the amount of power in the write signal. This is accomplished by modulating the write current with a duty cycle so that part of the time the write current is not being applied to the write transducer. The frequency of the duty cycle is sufficiently high so that the individual pulses overlap and blend in the magnetic medium. As a result, data written using the Uniform Pulse-Write method has the same read characteristics as data written using a non-pulsed method.

The Pulse-On-Transition method requires even less power than the Uniform Pulse-Write method. Pulse-On-Transition pulses the write current at the same time that the Full-Cell Write Equalization method inverts the write current's polarity. The Pulse-On-Transition method returns the write current to zero at the completion of each pulse. Because some pulses start from a zero write current condition, data written using this method has different read characteristics than data written using the Full-Cell Write Equalization method making the two methods incompatible. Another reason the two methods can have different read characteristics is that a portion of the magnetization in the write transducer may switch so slowly that the magnetization continues to increase as long as the transducer is energized. Therefore, the magnetic state before and after the polarity inversion may be very different for the two methods.

As recording densities increase, the signals from the read sensors will decrease causing a lower signal to noise ratio. To maintain a reasonable signal to noise ratio, the write current induced noise needs to be decreased. A new encoding method is required that produces less write current than the Full-Cell Write Equalization method. At the same time, the data written on magnetic medium using the new encoding method should have the same read characteristics as data written using the Full-Cell Write Equalization method to maintain compatibility with existing disk drives and tape drives.

DISCLOSURE OF INVENTION

The present invention is a method of generating an encoded signal from a sequential stream of digital data, where the encoded signal has a non-power carrying null state and a power carrying active state with two opposing polarities. Logical one bits are distinguished from logical zero bits in the data stream by inverting the polarity of the encoded signal at the start of only the logical one bits. The encoded signal is set to the active state during a bit set-up period before, and held in the active state during a bit hold period after each polarity inversion. At other times the encoded signal is set to the null state. The method may include the addition of equalization pulses during strings of consecutive logical zero bits to keep the encoded signal from remaining in the null state for extended periods. Each equalization pulse is preceded by an equalization set-up period, and followed by an equalization hold period during which the encoded signal is in the active state. Where the equalization hold period of one equalization pulse is contiguous with the equalization set-up period of the next equalization pulse, the equalization set-up period may be eliminated. The equalization set-up period may also be eliminated for select equalization pulses in a string of equalization pulses to balance the magnetic state of the write transducer. This approach is used for write transducers that have slow magnetization reversal mechanisms. The slow magnetization reversal mechanisms can result in an imbalance in the magnetization state when the write transducer is energized to one polarity longer than the opposite polarity, averaged over time during of the string of equalization pulses. Finally, the equalization pulse positions may be centered on the logical zero bits, spread uniformly in time between the logical one bit polarity inversions bounding the string, or in other positions appropriate for the write transducer, recording medium and read sensor.

In an application where the encoded signal is a write current used with a magnetic transducer, the preferred method encodes N−1 equalization pulses into each string of N consecutive logical zero bits. The equalization set-up period, equalization hold period, and equalization pulse periods are set at one-third the duration period of the logical bits. Longer and shorter pulse periods may be used. Data recorded on magnetic medium by a write current encoded by the preferred embodiment has compatible read characteristics with data recorded using the Full-Cell Write Equalization method.

Accordingly, it is an object of the present invention to provide a method for generating an encoded signal from a data stream, where the encoded signal has a non-power carrying state and a power carrying active state with two opposing polarities.

Another object is to distinguish between logical one bits and logical zero bits in the data stream by inverting the polarity of the encoded signal at the start of each logical one bit, but not the logical zero bits.

Another object is to set the encoded signal to the active state during a bit set-up period before, and during a bit hold period after inverting the polarity at the start of each logical one bit. The encoded signal remains in the null state at other times.

Another object is to add equalization pulses during strings of consecutive logical zero bits in the data stream. The encoded signal is set to the active state during each equalization pulse, during an equalization set-up period before some or all of the equalization pulses, and during an equalization hold period after each equalization pulse.

Yet another object is to control the equalization set-up periods to balance the time the encoded signal is active at each polarity during strings of equalization pulses.

These and other objects, features and advantages will be readily apparent upon consideration of the following detailed description in conjunction with the accompanying drawings.

BRIEF DESCRIPTION OF DRAWINGS

FIG. 1 is a plot of an encoded signal produced by the present invention;

FIG. 2 is a bar chart of the probability of consecutive logical zero bit strings in a random sample of data;

FIGS. 3A and 3B are plots of an encoded write current signal having equalization pulses in the same positions as the Full-Cell Write Equalization method, and the resulting read signal;

FIG. 4 is a plot of a write current signal from FIG. 3 having a variation on the encoding of the equalization pulses;

FIG. 5 is a plot of a write current signal having equalization pulses centered between the leading and trailing logical one bit transitions;

BEST MODE FOR CARRYING OUT THE INVENTION

Figure 6:
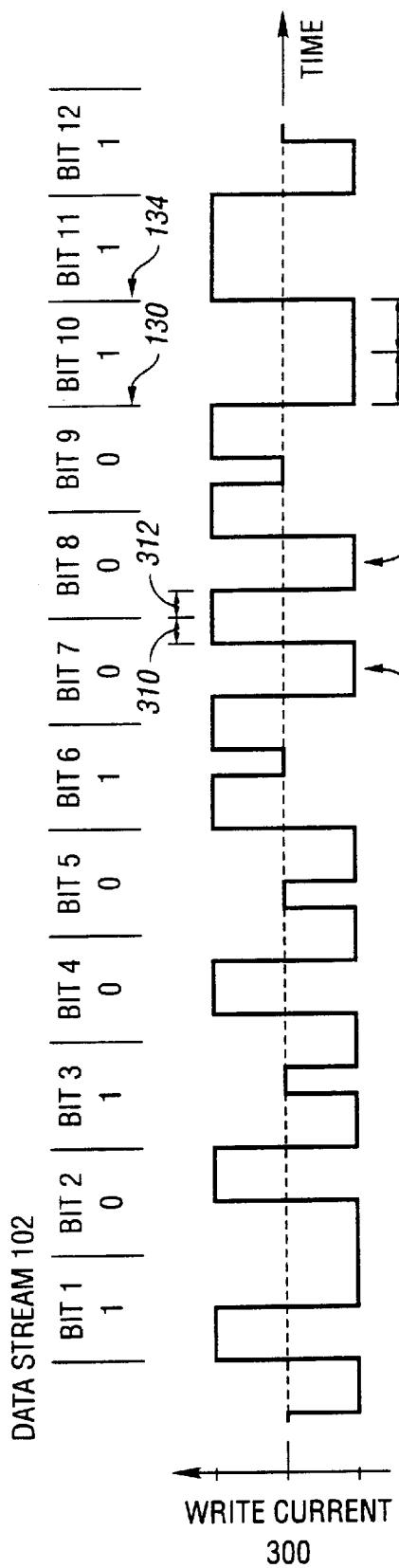
FIG. 6 is a plot of the write current signal from FIG. 3 where the write current has long set-up period and hold periods.

FIG. 1 is a plot of an encoded signal 100 produced from a data stream 102 using the method of the present invention. Each logical bit in data stream 102 has a value of logical one or logical zero, a bit starting time, and a duration period. Using bit 2 and bit 3 as an example, the bit starting time of bit 2 is shown by line 104 and the bit starting time for bit 3 is shown by line 106. The time separation between bit starting time 104 and bit starting time 106 is the duration period of bit 2. Bit 2 has a value 108 of logical zero. Encoded signal 100 has two states. The first state is a null state 110 where the encoded signal 100 carries no power. The second state is an active state where encoded signal 100 carries power with either a positive polarity 112, or a negative polarity 114.

Encoded signal 100 distinguishes between the logical one bits and logical zero bits in data stream 102 by inverting its polarity at the bit starting times of each logical one bit, and not the logical zero bits. The encoded signal 100 remains in the null state at all other times, including the duration of logical zero bits. Power carried by the encoded signal 100 is kept low by achieving the active state only during a bit set-up period immediately before, and a bit hold period immediately after the bit starting times of logical one bits. For example, bit 3 begins at bit starting time 106. At a bit set-up period 116 before bit starting time 106, the encoded signal 100 is set to the active state with the positive polarity 112. At bit starting time 106, the polarity of the encoded signal 100 in inverted to the negative polarity 114. During a bit hold period 118 after bit starting time 106, the encoded signal 100 remains in the active state with the negative polarity 114. After the bit hold period 118, the encoded signal 100 returns to the null state 110, shown in the figure as time 120. For the remainder of bit 3, all of bit 4, and most of bit 5, the encoded signal remains in the null state 110.

At a bit set-up period 122 before bit starting time 124 for bit 6, the encoded signal 100 is set to the active state. The polarity of encoded signal 100 during bit set-up period 122 is the same negative polarity 114 as during bit hold period 118. At bit starting time 124 the polarity of the encoded signal 100 is inverted again. The encoded signal 100 remains in the active state during bit hold period 126, and then transitions to the null state 110. This method is repeated for each logical one bit in data stream 102. During a bit set-up period before the bit starting time of each logical one bit, the encoded signal 100 is set to active with the same polarity it had last time it was active. The polarity is inverted at the bit starting time. After a bit hold period the encoded signal 100 is returned to the null state 110. Note that the first logical one bit in the data stream 102 has no prior active state polarity against which to reference. The method accounts for this by requiring that a starting polarity be defined as part of an initial condition. Either a positive polarity 112 or a negative polarity 114 may be used. In the example shown in FIG. 1, the negative polarity 114 is used as the initial condition.

Encoded signal 100 will be used to deliver power to a transducer or load in practical applications. Since the characteristics of various transducers and loads vary, the ideal bit set-up period and bit hold period of the encoded signal will vary from application to application. The bit set-up period will be longer than the bit hold period in some applications, shorter in others, and sometime the bit set-up period and bit hold period will have the same duration. The preferred embodiment provides symmetry among the bit set-up period, bit hold period and the minimum period the encoded signal 100 spends in the null state 110. An example of the minimum null state period is provided by bit 10 and bit 11. Since both bits have logical one values, the encoded signal 100 is active during the bit hold period 128 after the bit starting time 130 of bit 10, and active again during the bit set-up period 132 before the bit starting time 134 of bit 11. The time between bit hold period 128 and bit set-up period 132, shown in the figure as period 136, is the minimum period during which the encoded signal 100 is in the null state 110. For the hold period 128 to be the same as the bit set-up period 132 and the null state period 136, each is one-third of the duration period of bit 10.

Applying the method to the write current in tape drives and disk drives, the issue of consecutive logical zeros strings must be taken into account. When the write current is in an active state, the magnetic transducer orients the magnetic domain of the medium over a length of approximately three bits. This means that the bit hold period after each logical one bit starting time writes over the remainder of the logical one bit and up to two following logical zero bits. FIG. 2 shows the probability of having string of one to seven consecutive logical zero bits in 1,048,576 bytes of random data. Approximately 38% of the logical zero bits are bounded by logical one bits. The percentage decrease to less than a 1% probability of finding seven consecutive logical zero bits. The average string of consecutive logical zero bits is 2.33. The preferred embodiment accounts for this condition by adding equalization pulses to the encoded signal 100 during strings of two or more consecutive logical zero bits.

FIG. 3 is a plot of a write current 300 used by a typical magnetic transducer to write data on a magnetic medium, and the resulting read signal 302 produced by a typical magneto-resistive sensor. Write current 300 includes equalization pulses at the same positions in time as would be produced using the Full-Cell Write Equalization method. In the preferred embodiment, N−1 equalization pulses are encoded for each string of N consecutive logical zero bits, where N is at least 2. In general, N−X equalization pulses may be encoded for each string of N consecutive logical zero bits, where X is an integer equal to or less than N.

Encoding of the equalization pulses is similar to the encoding of the logical one bits. During an equalization set-up period before each equalization pulse starting time, the write current 300 is set to the active state with the same polarity as during the prior hold period. Write current 300 reverses polarity once at the equalization pulse starting time, and again at the equalization pulse ending time (returning to the same polarity as during the equalization set-up period before the equalization pulse). Finally, after an equalization hold period, the write current 300 is set to the null state. In a variation, some equalization pulses may be encoded without the equalization set-up period. For these equalization pulses, the write current 300 is set active at the equalization pulse starting time with the opposite polarity as during the prior hold period.

The relationship between equalization set-up periods, equalization hold periods and the duration between the equalization pulse starting time and equalization pulse ending time will vary from application to application. In some applications, the equalization periods and equalization pulse durations will be symmetrical, in others they will not. Likewise, the relationship between the bit set-up period, equalization set-up period, bit hold period and equalization hold period will vary from application to application. The bit periods may be longer, equal to, or shorter than the equalization periods. In the preferred embodiment, the set-up periods, hold periods and equalization pulse durations are all the same at one-third of the bit duration.

Positioning of the equalization pulses in the preferred embodiment may be designed to center them between the bit starting times of the logical one bits leading and trailing the string. For a string of N consecutive logical zero bits, one equalization pulse is centered on each of the first N−1 bits. The last ($N^{th}$) bit in the string does not have an equalization pulse. This is done so that the period between the polarity inversion, due to the logical one bit leading the string, and the center of the first equalization pulse is the same as the period between the center of the last equalization pulse and the polarity inversion due to the logical one bit trailing the string.

Bit 7, bit 8 and bit 9 are an example of three consecutive logical zero bits (N=3). The method encodes two (N−1) equalization pulses 304 and 306 during this string. Equalization pulse 304 is preceded by an active equalization set-up period 308, and followed by an equalization hold period 310. Equalization pulse 306 is preceded by an equalization set-up period 312 and followed by equalization hold period 314. Bit 9 does not have an equalization pulse. As a result, the period between the polarity inversion for bit 6 and the center of the equalization pulse 304, shown as period 316, matches the period between the polarity inversion for bit 10 and the center of the equalization pulse 306, shown as period 318.

Setting the equalization pulse periods to the preferred minimum one-third the duration period allows the equalization set-up period, equalization pulse duration, and equalization hold period to occur within one bit duration. When two equalization pulses appear back-to-back, as in bit 7 and bit 8, the equalization hold period 310 of one equalization pulse is contiguous with the equalization set-up period 312 of the next. The encoded signal does not return to the null state at the end of the equalization hold period 310. To account for this situation, the encoding method must look ahead to the next bit in the data stream 102. If the next set-up period begins during the current hold period, then the encoded signal is not returned to the null state at the end of the hold period. If the next set-up period will not occur during the current hold period, then the encoded signal is returned to the null state after the hold period has ended.

Data written on a magnetic medium by write current 300 produces the read signal 302. Read signal 302 reaches peak values at times 320–328. These correspond to the bit starting times for bits 1, 6, 10, 11 and 12. By including the N−1 equalization pulses, their associated equalization set-up periods, and equalization hold periods in the write current 300, the read signal 302 is the same as if the data had been written using the Full-Cell Write Equalization method. This allows a tape drive or disk drive implementing the present invention to swap magnetic medium with a tape drive or disk drive implementing the Full-Cell Write Equalization method.

FIG. 4 is an alternative encoding method that reduces the write current power required during consecutive equalization pulses. In this embodiment, where the equalization hold period of one equalization pulse is contiguous with the equalization set-up period of the next equalization pulse, the equalization set-up period of the next equalization pulse is eliminated. Data stream 102 shows an example of a five consecutive logical zero bit string in bit 13 through bit 17. Four equalization pulses 400–406 are generated centered on bit 13 through bit 16. The first equalization pulse 400 is preceded by an active equalization set-up period 408 followed by an equalization hold period 410, similar to equalization pulse 304 in FIG. 3. The second through forth equalization pulses 402–406 are generated without the equalization set-up periods. At the end of equalization hold period 410 the write current 300 is set to the null state. Write current 300 is set to the active state again with the opposite polarity as during equalization hold period 410 at the equalization pulse starting time 412 for equalization pulse 402. At the equalization pulse ending time, the polarity of write current 300 is inverted to the negative polarity where it remains active during equalization hold period 414. Write current 300 is set to the null state at the end of equalization hold period 414. The encoding for the second equalization pulse 402 is repeated for the third and forth equalization pulses 404 and 406. For a string of N consecutive logical zero bits there are N–2 consecutive equalization pulses encoded without the equalization set-up period. Using an average of N=2.33 consecutive logical zero bits, this method reduces the average time that the write current is active during equalization pulses by 11% as compared with the encoding method of FIG. 3.

Additional variations for encoding strings of equalization pulses may be employed to mitigate the effects of slow magnetization reversal mechanisms in the write transducers. The slow magnetization reversal mechanisms can result in an imbalance in the transducer's magnetization state when it is energized to one polarity for a greater average time than it is energized to the opposite polarity. To account for this behavior, strings of equalization pulses are encoded so that some, but not all of the equalization pulses are preceded by the equalization set-up period. One variation would be to precede only the first and the last equalization pulse in a long string of equalization pulses with the equalization set-up period. For example, in FIG. 4 equalization pulses 400 and 406 are preceded by an equalization set-up period while equalization pulses 402 and 404 are not. Another variation would be to precede every other equalization pulse with the equalization set-up period. Here, equalization pulses 400 and 404 are preceded by the equalization set-up period, while equalization pulses 402 and 406 are not. Many variations of this approach may be applied where the equalization set-up periods of select equalization pulses are of zero duration.

FIG. 5 is another method for producing the equalization pulses. In this method the period between equalization pulse centers, and the periods between the end equalization pulse centers and the logical one bit polarity inversions leading and trailing the string are the same. For a string of N consecutive logical zero bits and N–X equalization pulses, the uniform spacing is (N+1)/(N–X+1) duration periods. Write current 300 shows two examples of uniform equalization pulse spacing for X=1. In the first example, bit 7 through bit 9 form a three consecutive logical zero bit string (N=3). The uniform spacing 500 for this string is four-thirds the duration period. The net effect is that equalization pulse 304 is shifted earlier in time in FIG. 5 than in FIG. 3, while equalization pulse 306 is shifted later in time. Note that using this encoding method the equalization hold period 310 is not contiguous with the equalization set-up period 312 as they are in FIG. 3. In the second example, bits 13 through bit 17 form a string of five consecutive logical zero bits. The uniform spacing 502 for this string is six-fifths the duration period.

Other variations of the equalization pulses can be employed within the scope of the present invention. For example, the encoding may use only N–2 equalization pulses in a string of N consecutive logical zero bits. Overall, N–X equalization pulses may be inserted into a string of N consecutive logical zero bit in a variety of positions with respect to the logical one and logical zero bits. The integer X and the positioning of the equalization pulses are determined by the characteristics of the medium recording the encoded data, the read sensor reading the data, and the minimum number of zeros allowed between consecutive ones by a modulation code.

FIG. 6 shows another embodiment of the present invention that accounts for slow rise times in the write transducer. In this encoding method the width of the set-up periods, hold periods, and equalization pules periods are longer than the preferred one-third duration period. Wider write current pulses provide more time for the write transducer to orient the magnetic domain in the magnetic medium. The tradeoff is an overall increase in the write current power, and thus in the noise coupled to the read signal 302 (not shown). As shown in FIG. 6, write current 300 has set-up periods, hold periods and equalization pulse periods of one-half the duration period. This method causes some hold periods to merge with the preceding set-up periods. For example, the bit hold period 128 following the bit starting time 134 of bit 10 is contiguous with the bit set-up period 132 preceding bit starting time 134 of bit 11. In another example, the equalization hold period 310 following equalization pulse 304 overlaps with the equalization set-up period 312 preceding equalization pulse 306.

Figure 7:
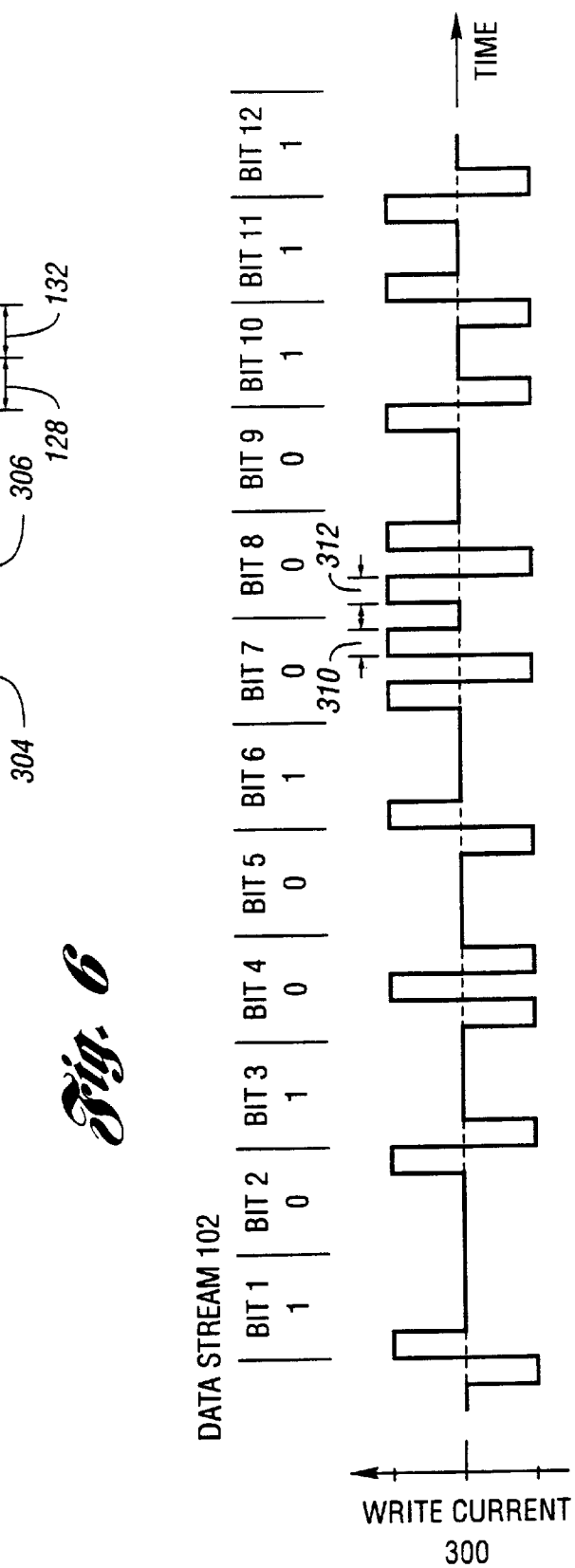
FIG. 7 is a plot of the write current signal from FIG. 3 where the write current has short set-up periods and hold periods.

FIG. 7 is an embodiment for use where the rise time of the write transducer and medium are fast. The set-up periods, hold periods and equalization pulse widths in this example at one-quarter the duration period. Write current 300 is in the active state for short durations of time, so the power supplied to the write transducer is reduced as comparted with the preferred embodiment. The magnetic medium used with this embodiment must be able to orient its magnetic domain quickly to capture the data. One feature of this embodiment to note is that the equalization hold period and equalization set-up period of consecutive equalization pulses are not contiguous. See for example equalization hold period 310 and equalization set-up period 312 in bit 7 and bit 8. Other short pulse periods may be used within the scope of the present invention. The practical limitation for short pulse periods will be either the response of the transducer using the encoded signal, or the medium recording the data.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for generating an encoded signal from a data stream, where the encoded signal has a null state and an active state with opposing polarities, and wherein the data stream has logical one bits and logical zero bits, each logical one bit and logical zero bit having a bit starting time, the method comprising:

establishing a starting polarity of the opposing polarities;

setting the encoded signal to the active state at approximately a bit set-up period prior to the bit starting time of each logical one bit in the data stream;

inverting the polarity of the encoded signal at approximately the bit starting time of each logical one bit in the data stream; and setting the encoded signal to the null state at approximately a bit hold period after the bit starting time of each logical one bit where no subsequent setting of the encoded signal to the active state occurs during the bit hold period.

2. The method of claim 1 wherein the encoded signal remains in the null state in response to each logical zero bit.

3. The method of claim 1 further comprising:

detecting each string of at least one consecutive logical zero bit in the data stream;

defining at least one equalization pulse during each string of at least one consecutive logical zero bit in response to detecting each string of at least one consecutive logical zero bit in the data stream, where each equalization pulse of the at least one equalization pulse has an equalization pulse starting time and an equalization pulse ending time;

setting the encoded signal to the active state at approximately an equalization set-up period prior to each equalization pulse starting time;

inverting the polarity of the encoded signal at approximately each equalization pulse starting time;

inverting the polarity of the encoded signal at approximately each equalization pulse ending time; and setting the encoded signal to the null state at approximately an equalization hold period after each equalization pulse ending time where no subsequent setting of the encoded signal to the active state occurs during the equalization hold period.

4. The method of claim 3 further comprising setting the equalization set-up period of at least one selected equalization pulse to approximately zero duration in response to defining at least one equalization pulse during each string of at least one consecutive logical zero bit.

5. The method of claim 4 wherein the at least one equalization pulse is at least two equalization pulses, and the at least one selected equalization pulse is each equalization pulse except the first equalization pulse of the at least two equalization pulses.

6. The method of claim 4 wherein the at least one equalization pulse is at least two equalization pulses, and the at least one selected equalization pulse is every other equalization pulse of the at least two equalization pulses.

7. The method of claim 4 wherein the at least one equalization pulse is at least three equalization pulses, and the at least one selected equalization pulse is each equalization pulse except the first equalization pulse and the last equalization pulse of the at least three equalization pulses.

8. The method of claim 1 further comprising:

detecting each string having a multiple number of consecutive logical zero bits in the data stream;

defining a number of equalization pulses during each string having the multiple number of consecutive logical zero bits in response to detecting each string having the multiple number of consecutive logical zero bits, wherein the number of equalization pulses ranges from one to less than the multiple number of consecutive logical zero bits respectively, and each equalization pulse of the number of equalization pulses has an equalization pulse starting time and an equalization pulse ending time;

setting the encoded signal to the active state at approximately an equalization set-up period prior to each equalization pulse starting time;

inverting the polarity of the encoded signal at approximately each equalization pulse starting time;

inverting the polarity of the encoded signal at approximately each equalization pulse ending time; and setting the encoded signal to the null state at approximately an equalization hold period after each equalization pulse ending time where no subsequent setting of the encoded signal to the active state occurs during the equalization hold period.

9. The method of claim 8 where the number of equalization pulses is one less than the multiple number of consecutive logical zero bits respectively, and each equalization pulse is approximately centered in time on each logical zero bit, except the last logical zero bit in each string having the multiple number of consecutive logical zero bits.

10. The method of claim 9 wherein each logical bit has a duration period, and wherein the bit set-up period, the bit hold period, the equalization set-up period and the equalization hold period are approximately one-third of the duration period, and for each equalization pulse the equalization pulse ending time occurs approximately one-third of the duration period after the equalization pulse starting time respectively.

11. The method of claim 1 wherein the encoded signal is a write current for use with a magnetic write transducer.

* * * * *